(12) United States Patent
Kwon et al.

(10) Patent No.: US 11,158,822 B2
(45) Date of Patent: Oct. 26, 2021

(54) DISPLAY DEVICE INCLUDING A COATING LAYER HAVING DECREASING THICKNESS

(71) Applicant: SAMSUNG DISPLAY CO., LTD., Yongin (KR)

(72) Inventors: Seungwook Kwon, Hwaseong-si (KR); Hyoungsub Lee, Yongin-si (KR); Wooyong Sung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 132 days.

(21) Appl. No.: 16/440,555

(22) Filed: Jun. 13, 2019

(65) Prior Publication Data

US 2020/0091445 A1 Mar. 19, 2020

(30) Foreign Application Priority Data

Sep. 18, 2018 (KR) .................. 10-2018-0111532

(51) Int. Cl.
*H01L 29/08* (2006.01)
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3244* (2013.01); *H01L 51/529* (2013.01); *H01L 2251/5338* (2013.01); *H01L 2251/556* (2013.01); *H01L 2251/558* (2013.01)

(58) Field of Classification Search
CPC ............ H01L 51/0097; H01L 27/3244; H01L 51/529; H01L 2251/556; H01L 2251/5338; H01L 2251/558; H01L 51/5253; H01L 51/5237; H01L 27/3248; Y02E 10/549; G09F 9/301; G09G 3/3225; G09G 3/3275
See application file for complete search history.

(56) References Cited

U.S. PATENT DOCUMENTS

| | | | | |
|---|---|---|---|---|
| 6,781,926 B2* | 8/2004 | Ishizaki | .................. | G11B 7/121 369/13.13 |
| 7,179,680 B2* | 2/2007 | Fries | .................... | G02B 6/4204 257/13 |
| 7,242,398 B2* | 7/2007 | Nathan | ............... | H01L 27/3244 345/206 |
| 7,463,401 B2* | 12/2008 | Feldman | ................ | B82Y 10/00 359/280 |
| 8,723,824 B2* | 5/2014 | Myers | ................... | G06F 3/0446 345/173 |
| 9,406,898 B2* | 8/2016 | Yamazaki | ............. | H01L 51/524 |
| 9,485,858 B2 | 11/2016 | Namkung et al. | | |
| 9,614,168 B2 | 4/2017 | Zhang et al. | | |

(Continued)

FOREIGN PATENT DOCUMENTS

| KR | 10-2015-0062237 A | 6/2015 |
|---|---|---|
| KR | 10-1796813 B1 | 11/2017 |
| KR | 10-2018-0003684 A | 1/2018 |

*Primary Examiner* — Caleb E Henry
(74) *Attorney, Agent, or Firm* — Lewis Roca Rothgerber Christie LLP

(57) ABSTRACT

A display device includes a display panel that is bent with respect to a bending area. A coating layer is disposed below the display panel and may include a resin. A portion of the coating layer, which is adjacent to the bending area, may have a thickness that gradually decreases in a direction toward the bending area.

21 Claims, 14 Drawing Sheets

(56) References Cited

U.S. PATENT DOCUMENTS

| | | | |
|---|---|---|---|
| 9,620,742 B2* | 4/2017 | Kim | H01L 51/529 |
| 9,769,919 B2* | 9/2017 | Park | H05K 1/147 |
| 9,793,502 B2* | 10/2017 | Saeki | H01L 51/0097 |
| 10,090,478 B2* | 10/2018 | Ahn | G06F 3/0443 |
| 10,462,896 B1* | 10/2019 | Kwon | H01L 51/0097 |
| 10,818,873 B2* | 10/2020 | Kwon | H01L 51/0097 |
| 10,826,003 B2* | 11/2020 | Um | H01L 51/5253 |
| 2009/0021666 A1* | 1/2009 | Chen | G02F 1/133305 |
| | | | 349/58 |
| 2014/0042406 A1* | 2/2014 | Degner | H01L 27/3297 |
| | | | 257/40 |
| 2014/0217382 A1* | 8/2014 | Kwon | H01L 51/5246 |
| | | | 257/40 |
| 2014/0240985 A1* | 8/2014 | Kim | H05K 1/028 |
| | | | 362/249.04 |
| 2014/0306941 A1* | 10/2014 | Kim | H04M 1/0268 |
| | | | 345/204 |
| 2015/0227172 A1* | 8/2015 | Namkung | G06F 1/1652 |
| | | | 345/173 |
| 2015/0313004 A1* | 10/2015 | Namkung | G02F 1/133308 |
| | | | 361/749 |
| 2016/0007441 A1* | 1/2016 | Matsueda | H01L 51/0097 |
| | | | 361/749 |

\* cited by examiner

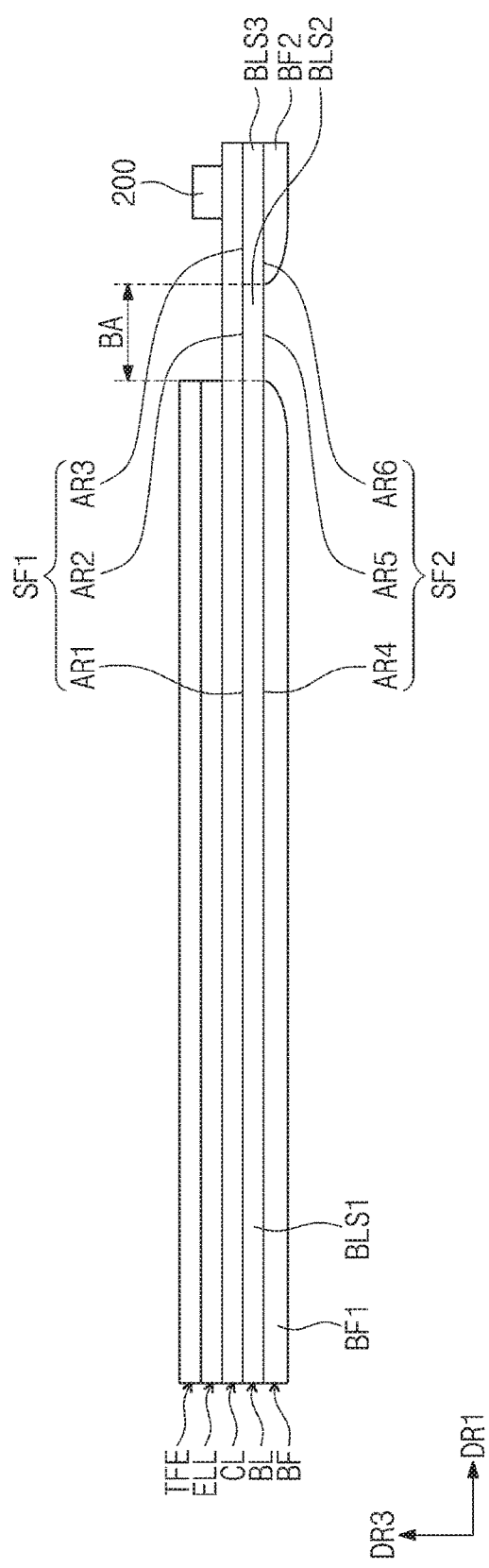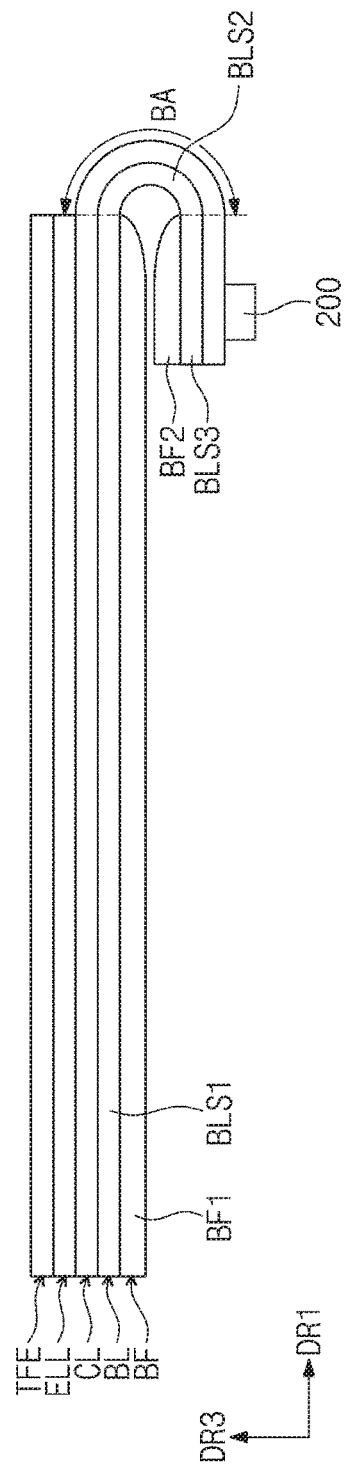

DISPLAY DEVICE INCLUDING A COATING LAYER HAVING DECREASING THICKNESS

CROSS-REFERENCE TO RELATED APPLICATION

This patent application claims priority to and the benefit of Korean Patent Application No. 10-2018-0111532, filed on Sep. 18, 2018 in the Korean Intellectual Property Office, the entire content of which is herein incorporated by reference.

BACKGROUND

1. Field

Aspects of embodiments of the present disclosure relate to a display device including a foldable display panel.

2. Description of Related Art

A display device displays various images on a display screen to provide information to a user. In general, the display device displays information within an allocated screen. In recent years, flexible display devices including a foldable flexible display panel have been developed. The flexible display device may be foldable, rollable, or bendable, unlike a rigid display device. The flexible display device, which is variously changeable in shape, may be carried regardless of a typical screen size and be thus improved in convenience of the user.

The display device may include a display panel, and a film for protecting or supporting the display panel may be disposed below the display panel.

Due to a thickness of the above-described film, when a portion of the display panel is folded, portions of the film may contact each other and cause damage to the portions of the film.

SUMMARY

According to an aspect of embodiments of the present disclosure, a display device has a structure in which a coating layer disposed below the display panel is not damaged when a portion of the display panel is folded.

According to one or more embodiments of the inventive concept, a display device includes a base layer, a light emitting element layer, a driving circuit, and a first coating layer.

The base layer includes a first portion, a second portion extending from the first portion and bent to have a curvature (e.g., a predetermined curvature), and a third portion extending from the second portion and facing the first portion.

The light emitting element layer is disposed on a first surface of the first portion and includes a plurality of light emitting elements.

The driving circuit is disposed on a first surface of the third portion and electrically connected to the plurality of light emitting elements.

The first coating layer is disposed on a second surface of the first portion and includes a first coating portion and a second coating portion extending from the first coating portion and disposed adjacent to the second portion, and the second coating portion has a thickness less than that of the first coating portion.

In an embodiment, the first coating layer may contact the second surface of the first portion.

In an embodiment, the first coating layer may comprise a resin.

In an embodiment, the thickness of the second coating portion may gradually decrease in a direction toward the second portion.

In an embodiment, an end of the second coating portion may have a rounded shape in a cross-section.

In an embodiment, the display device may further include a second coating layer disposed on the second surface of the third portion and including a third coating portion and a fourth coating portion extending from the third coating portion and disposed adjacent to the second portion, and the fourth coating portion may have a thickness less than that of the third coating portion.

In an embodiment, the second coating layer may contact the second surface of the third portion.

In an embodiment, the second coating layer may comprise a resin.

In an embodiment, the thickness of the fourth coating portion may gradually decrease in a direction toward the second portion.

In an embodiment, an end of the fourth coating portion may have a rounded shape in a cross-section.

In an embodiment, the first coating layer may contact only the first portion of the base layer, and the second coating layer may contact only the third portion of the base layer.

In an embodiment, the first coating layer and the second coating layer may face each other.

In an embodiment, each of the thickness of the first coating portion and the thickness of the third coating portion may be about 75 μm or more and about 100 μm or less.

In an embodiment, at least one of the first coating layer and the second coating layer may include a plurality of sub-coating layers.

In an embodiment, the plurality of sub-coating layers may have different lengths from each other.

In an embodiment of the inventive concept, a display device includes a base layer, a circuit layer, a light emitting element layer, and a first coating layer.

The base layer includes a first surface and a second surface facing away from the first surface. Here, the first surface includes a first area, a second area extending from the first area, and a third area extending from the second area, and the second surface includes a fourth area opposite the first area, a fifth area opposite the second area, and a sixth area opposite the third area.

The circuit layer contacts the first surface and includes a plurality of transistors and signal lines that are electrically connected to the plurality of transistors.

The light emitting element layer includes a plurality of light emitting elements that are electrically connected to the plurality of transistors and overlaps the first area.

The first coating layer contacts the fourth area and has a portion having a thickness that gradually decreases in a direction toward the fifth area.

BRIEF DESCRIPTION OF THE FIGURES

The accompanying drawings are included to provide a further understanding of the inventive concept, and are incorporated in and constitute a part of this specification. The drawings illustrate some exemplary embodiments of the inventive concept and, together with the description, serve to explain principles of the inventive concept. In the drawings:

FIGS. 9A and 9B are views exemplarily illustrating a display panel and a coating layer according to an embodiment of the inventive concept;

DETAILED DESCRIPTION

Figure 1:
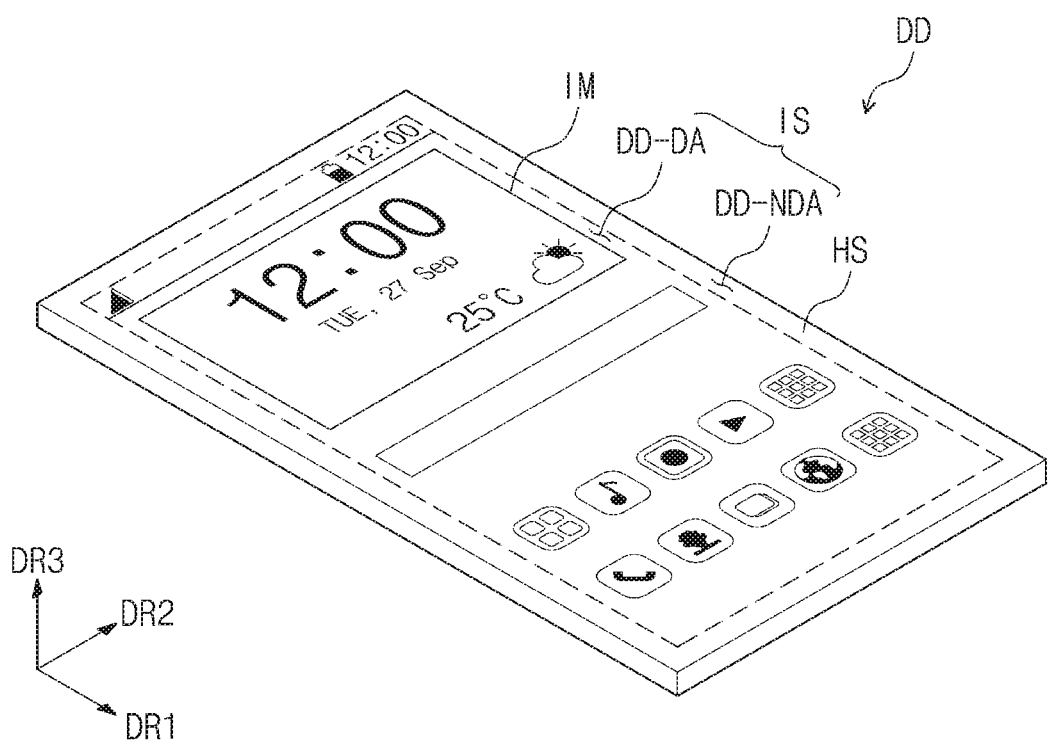
FIG. 1 is a perspective view illustrating a display device according to an embodiment of the inventive concept.

Herein, some exemplary embodiments of the inventive concept will be described with reference to the accompanying drawings.

In the figures, the thickness, ratio, and dimensions of components may be exaggerated for clarity of illustration. As used herein, the term "and/or" includes any and all combinations of one or more of the associated listed items.

As used herein, "include" or "comprise" specifies a property, a fixed number, a step, an operation, an element, a component, or a combination thereof, but does not exclude other properties, fixed numbers, steps, operations, elements, components, or combinations thereof.

Where an element is described as being related to another element, such as being "on" another element or "located on" a different element or a layer, this includes both a case in which an element is located directly on another element or a layer and a case in which an element is located on another element via another layer or still another element. In contrast, where an element is described as being related to another element, such as being "directly on" another element or "located directly on" a different element or a layer, this indicates a case in which an element is located on another element or a layer with no intervening element or layer therebetween.

Throughout the specification, the same reference numerals are used for the same or similar parts.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating a display device DD according to an embodiment of the inventive concept. As illustrated in FIG. 1, a display surface IS on which an image IM is displayed is parallel to a surface defined by a first directional axis DR1 and a second directional axis DR2. A normal direction of the display surface IS, i.e., a thickness direction of the display device DD, is indicated by a third directional axis DR3. A front surface (or top surface) and a rear surface (or bottom surface) of each of members are distinguished by the third directional axis DR3. However, directions indicated by the first to third directional axes DR1, DR2, and DR3 may be a relative concept and varied with respect to each other. Herein, the first to third directions may be directions indicated by the first to third directional axes DR1, DR2, and DR3 and designated by the same reference numerals, respectively.

The display device DD according to an embodiment of the inventive concept may be a foldable display device. The display device DD according to an embodiment of the inventive concept may be used for large-sized electronic equipment, such as televisions and monitors, and small and middle-sized electronic equipment, such as mobile phones, tablet PCs, navigation units for vehicles, game consoles, and smart watches.

As illustrated in FIG. 1, the display surface IS of the display device DD may include a plurality of areas. The display device DD includes a display area DD-DA on which the image IM is displayed and a non-display area DD-NDA disposed adjacent to the display area DD-DA. The non-display area DD-NDA may be an area on which an image is not displayed. FIG. 1 illustrates icons of applications and a clock window as an example of the image IM. In an embodiment, the display area DD-DA may have a rectangular shape, and the non-display area DD-NDA may surround the display area DD-DA. However, the embodiment of the inventive concept is not limited thereto. For example, the display area DD-DA and the non-display area DD-NDA may be variously designed in shape.

The display device DD may include a housing HS. The housing HS may be disposed at an outer portion of the display device DD and accommodate components therein.

FIGS. 2A to 2E are views each exemplarily illustrating a state in which the display device DD in FIG. 1 may be folded.

Figure 2A:
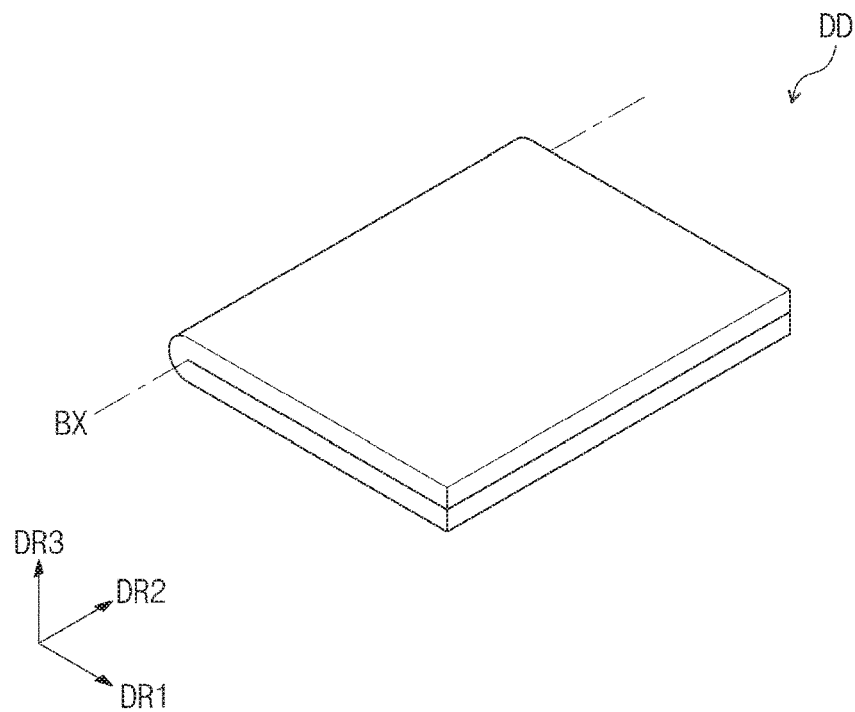
FIGS. 2A to 2E are views each illustrating a state in which the display device in FIG. 1 may be folded.
Figure 2B:
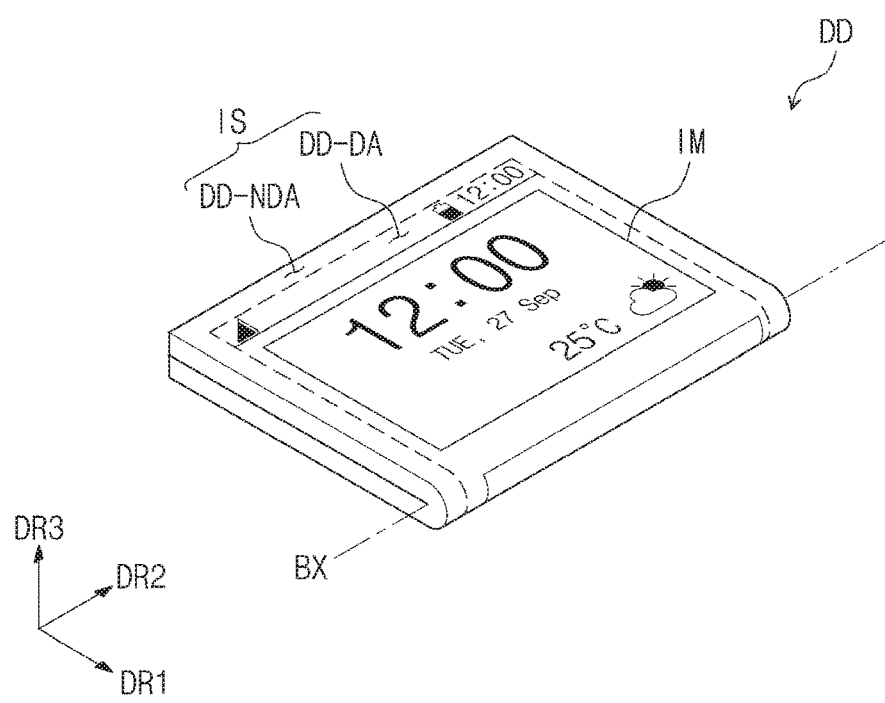
Figure 2C:
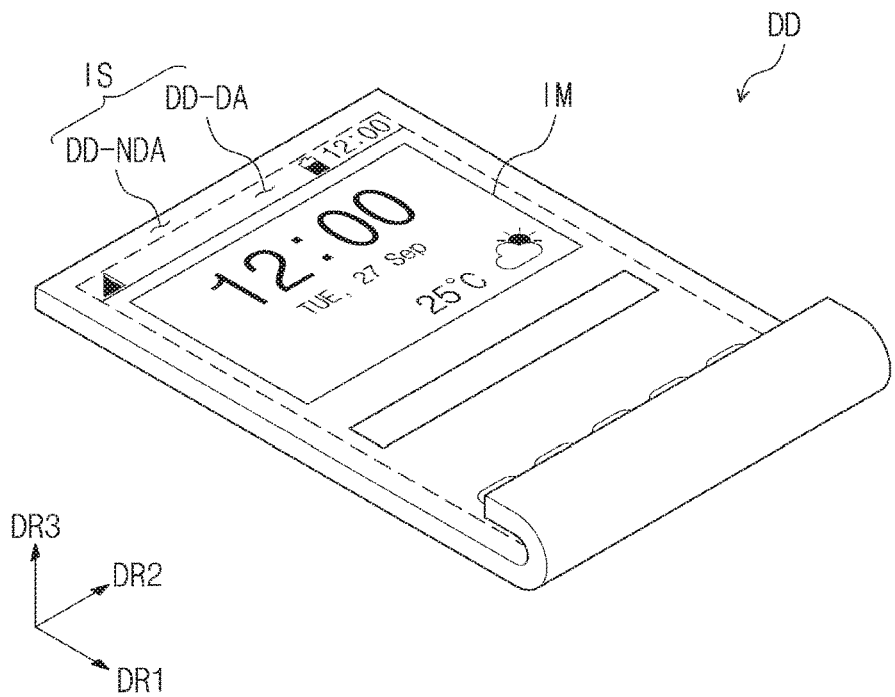
Figure 2D:
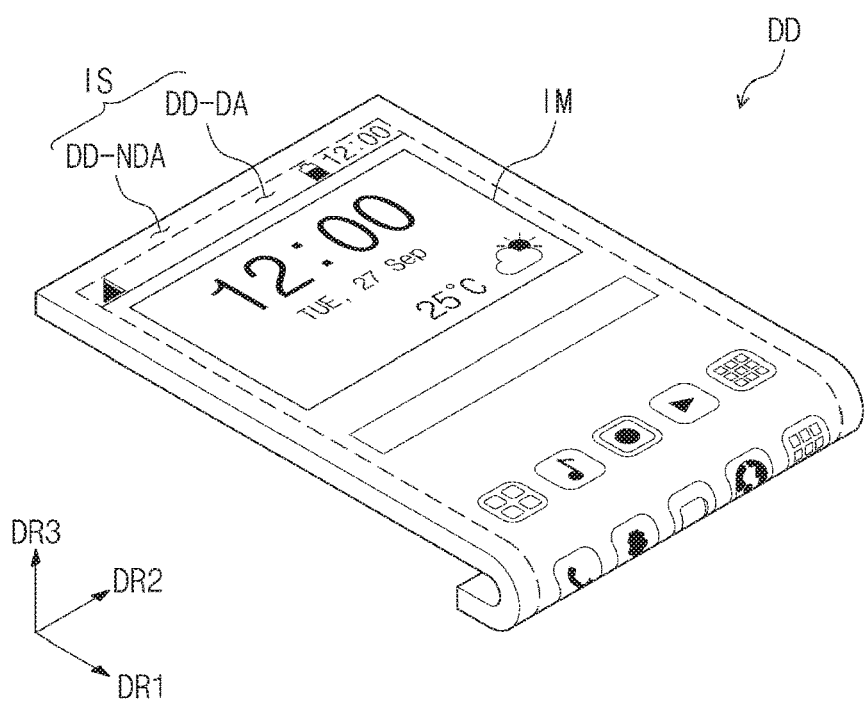
Figure 2E:
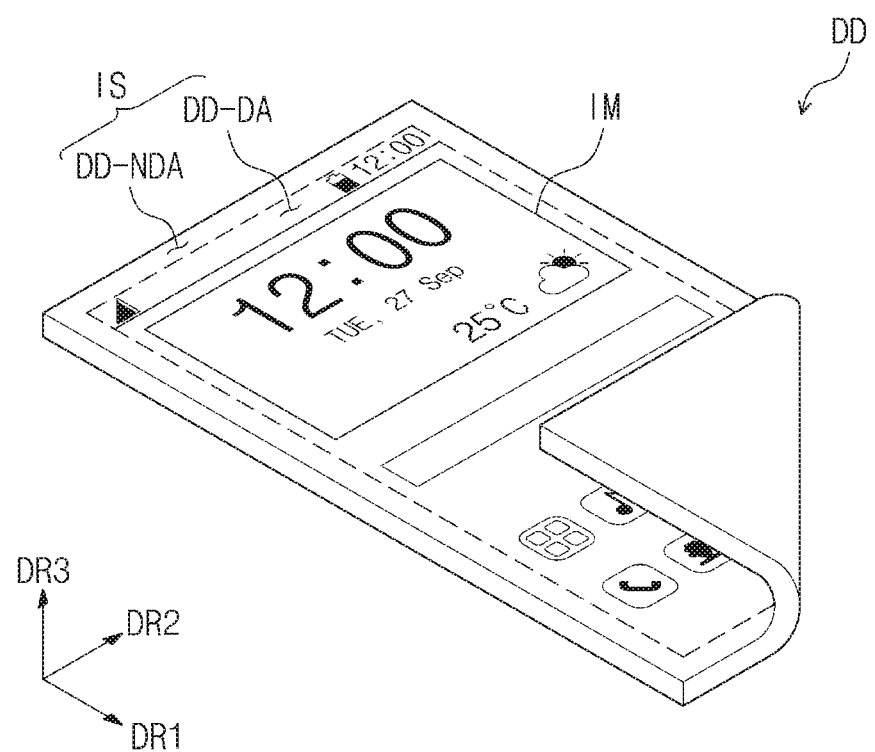

Referring to FIG. 2A, the display device DD according to an embodiment of the inventive concept may be in-folded with respect to a bending axis BX. Referring to FIG. 2B, the display device DD according to an embodiment of the inventive concept may be out-folded with respect to the bending axis BX. Referring to FIG. 2C, the display device DD according to an embodiment of the inventive concept may be folded inward from an end of the display device DD. Referring to FIG. 2D, the display device DD according to an embodiment of the inventive concept may be folded outward from the end of the display device DD. Referring to FIG. 2E, the display device DD according to an embodiment of the inventive concept may be folded in a diagonal direction. Although methods of folding the display device DD are exemplarily illustrated in FIGS. 2A to 2E, embodiments of the inventive concept are not limited thereto.

Figure 3:
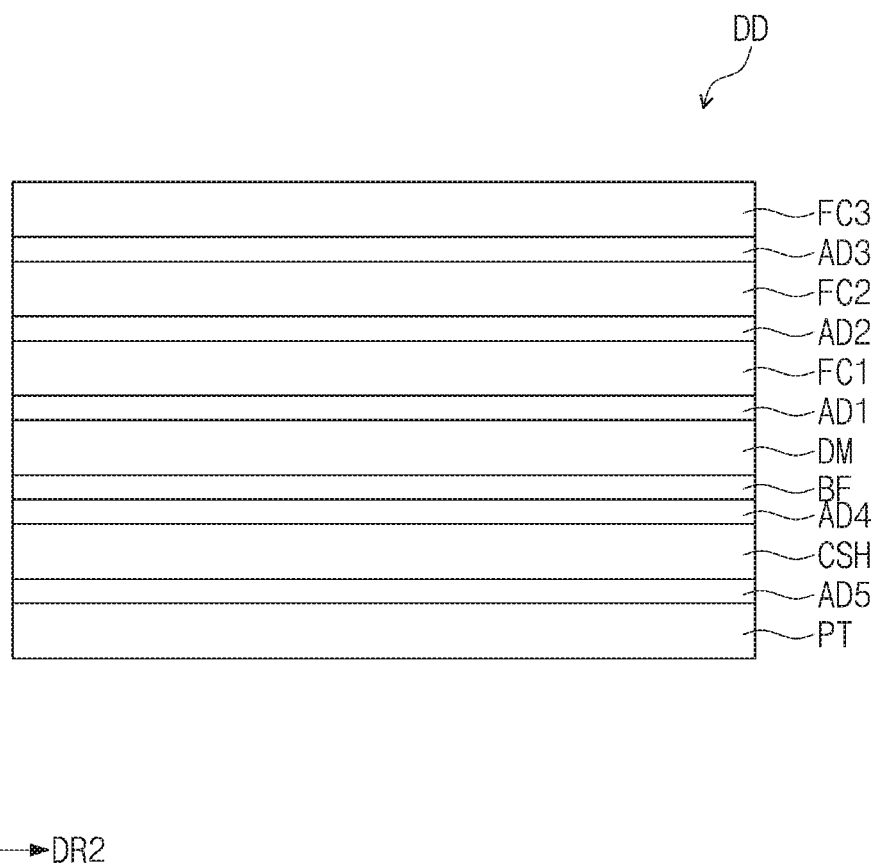
FIG. 3 is a cross-sectional view illustrating a display device according to an embodiment of the inventive concept.
Figure 4A:
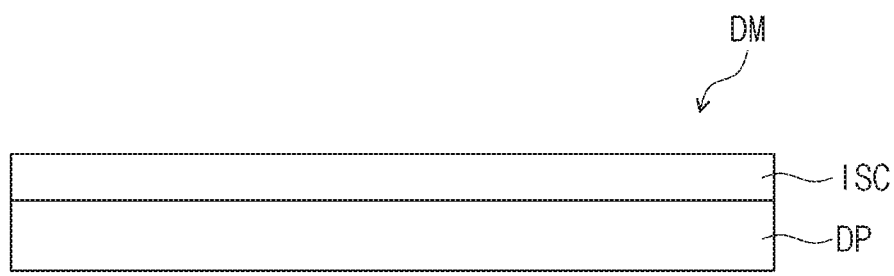
FIGS. 4A and 4B are cross-sectional views illustrating a display module, respectively, according to an embodiment of the inventive concept.
Figure 4B:
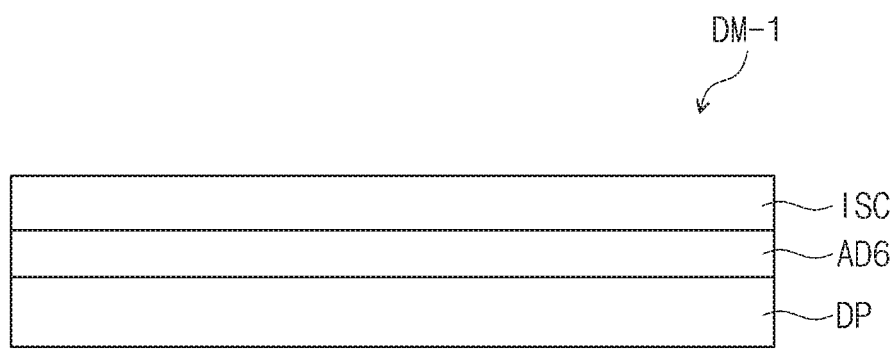

FIG. 3 is a cross-sectional view illustrating the display device DD according to an embodiment of the inventive concept. FIGS. 4A and 4B are cross-sectional views illustrating a display module DM and DM-1, respectively, according to an embodiment of the inventive concept. FIG. 3 illustrates a cross-section defined by the second direction DR2 and the third direction DR3.

The display device DD may include a display module DM, a plurality of functional layers FC1 to FC3, a coating layer BF, an impact absorbing member CSH, a support member PT, and a plurality of adhesion members AD1 to AD5.

In an embodiment of the inventive concept, each of the adhesion members AD1 to AD5 may be a pressure sensitive adhesive (PSA).

The functional layers FC1 to FC3 may be disposed above the display module DM.

The first functional layer FC1 may be attached to the display module DM by the first adhesion member AD1. The second functional layer FC2 may be attached to the first functional layer FC1 by the second adhesion member AD2. The third functional layer FC3 may be attached to the second functional layer FC2 by the third adhesion member AD3.

Each of the functional layers FC1 to FC3 may contain a polymer material. Each of the functional layers FC1 to FC3 may be a film-type. In an embodiment, each of the functional layers FC1 to FC3 may have a modulus of about 2 GPa or more and about 100 GPa or less.

In an embodiment, each of the functional layers FC1 to FC3 may have a thickness of about 35 μm or more and about 60 μm or less. When each of the functional layers FC1 to FC3 has a thickness less than about 35 μm, performance of an originally intended function may be degraded, and when greater than about 60 μm, flexibility of the display device DD may decrease. In an embodiment of the inventive concept, the first functional layer FC1 may be a polarizing functional layer that polarizes incident light. The second functional layer FC2 may be an impact absorbing functional layer for absorbing an impact applied from the outside. The third functional layer FC3 may be a window functional layer providing an external shape of the display device DD. In another embodiment of the inventive concept, one or more of the first to third functional layers FC1 to FC3 may be omitted.

The coating layer BF, the impact absorbing member CSH, and the support member PT are disposed below the display module DM.

In an embodiment, the coating layer BF may be directly attached to the display module DM. The coating layer BF may contain a polymer material. For example, the coating layer BF may contain an acrylate-based material, polyurethane, or polyethylene. However, embodiments of the inventive concept are not limited thereto. The coating layer BF will be described in further detail with reference to FIGS. 9A to 10.

The impact absorbing member CSH may be attached to the coating layer BF by the fourth adhesion member AD4. The impact absorbing member CSH may contain a polymer material. The impact absorbing member CSH may be a layer for absorbing an impact applied from the outside.

The support member PT may be attached to the impact absorbing member CSH by the fifth adhesion member AD5. The support member PT may support the display module DM. In an embodiment, the support member PT may include a hinge (not shown) for folding or bending the display module DM. The support member PT may have a rigid property.

Referring to FIG. 4A, the display module DM may include a display panel DP and an input sensing circuit ISC. The input sensing circuit ISC may detect a touch and/or a pressure applied from the outside.

The input sensing circuit ISC may be directly disposed on a thin-film encapsulation layer (not shown) of the display panel DP. Here, a feature of "directly disposed" represents that the input sensing circuit ISC is disposed on the display panel PD without an additional adhesion member therebetween.

Referring to FIG. 4B, a display module DM-1 according to another embodiment may include a display panel DP, an input sensing circuit ISC, and a sixth adhesion member AD6. The display panel DP and the input sensing circuit ISC may be attached by the sixth adhesion member AD6.

Figure 5:
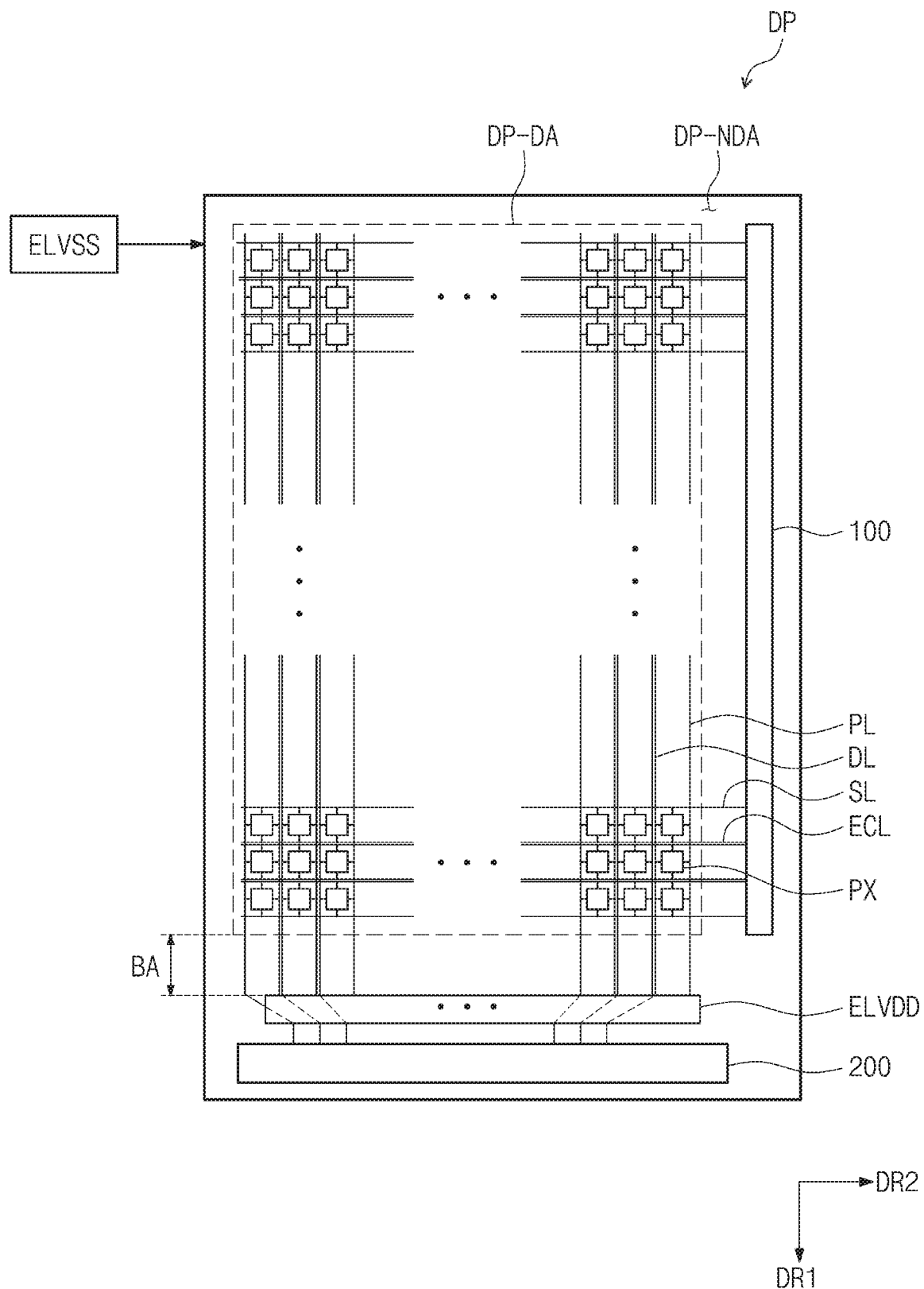
FIG. 5 is a view illustrating a display panel according to an embodiment of the inventive concept.

FIG. 5 is a view illustrating the display panel DP according to an embodiment of the inventive concept.

The display panel layer DP includes a display area DP-DA and a non-display area DP-NDA on a plane. In an embodiment, the non-display area DP-NDA may be defined along an edge of the display area DP-DA. The display area DP-DA and the non-display area DP-NDA of the display panel DP correspond to the display area DP-DA and the non-display area DP-NDA of the display device DD in FIG. 1, respectively.

The display panel DP may include a scan driving unit 100, a data driving unit 200, a plurality of scan lines SL, a plurality of light emitting control lines ECL, a plurality of data lines DL, a plurality of power lines PL, and a plurality of pixels PX (herein, referred to as pixels). The pixels PX are disposed on the display area DP-DA. Each of the pixels PX includes an organic light emitting element OLED (refer to FIG. 6) and a pixel circuit CC (refer to FIG. 6) connected thereto.

The scan driving unit 100 may include a scan driving part and a light emitting control driving part.

The scan driving part generates scan signals, and the generated scan signals are sequentially output to the scan lines SL. The light emitting control driving part generates light emitting control signals, and outputs the generated light emitting control signals to the light emitting control lines ECL.

In another embodiment of the inventive concept, the scan driving part and the light emitting control driving part may be integrated into one circuit without being divided from each other in the scan driving unit 100.

The scan driving unit 100 may include a plurality of thin-film transistors that are formed through the same process as the driving circuit of each of the pixels PX, e.g., a low temperature polycrystalline silicon (LTPS) process or a low temperature polycrystalline oxide (LTPO) process.

The data driving unit 200 outputs data signals to the data lines DL. The data signals are analog voltages corresponding to gradation value of image data.

In an embodiment of the inventive concept, the data driving unit 200 may be directly mounted to the display panel DP. However, embodiments of the inventive concept are not limited thereto. In another embodiment of the inventive concept, the data driving unit 200 may be mounted to a printed circuit board (not shown), and the printed circuit board (not shown) may be connected to pads disposed on one end of the data lines DL.

The scan lines SL may extend in the second direction DR2 and be arranged in the first direction DR1 crossing the second direction DR2. Although the second direction DR2 and the first direction DR1 may be perpendicular to each other in an embodiment of the inventive concept, embodiments of the inventive concept are not limited thereto.

The light emitting control lines ECL may extend in the second direction DR2 and be arranged in the first direction DR1. That is, each of the light emitting control lines ECL may be arranged in parallel to the corresponding scan line of the scan lines SL.

The data lines DL may extend in the first direction DR1 and be arranged in the second direction DR2 crossing the first direction DR1. The data lines DL may provide the data signals to the corresponding pixels PX.

The power lines PL extend in the first direction DR1 and are arranged in the second direction DR2. The power lines PL may provide a first power ELVDD to the corresponding pixels PX.

Each of the plurality of pixels PX is connected to the corresponding scan line of the scan lines SL, the corresponding light emitting control line of the light emitting control lines ECL, the corresponding data line of the data lines DL, and the corresponding power line of the power lines PL.

The non-display area DP-NDA of the display panel DP may include a bending area BA. When the display panel DP is bent with respect to the bending area BA, a surface area of the non-display area DP-NDA may be decreased to provide the display device DD having a narrow bezel on a plane defined by the first direction DR1 and the second direction DR2. That is, the display device DD in which the non-display area DD-NDA in FIG. 1 has a small surface area may be provided.

Figure 6:
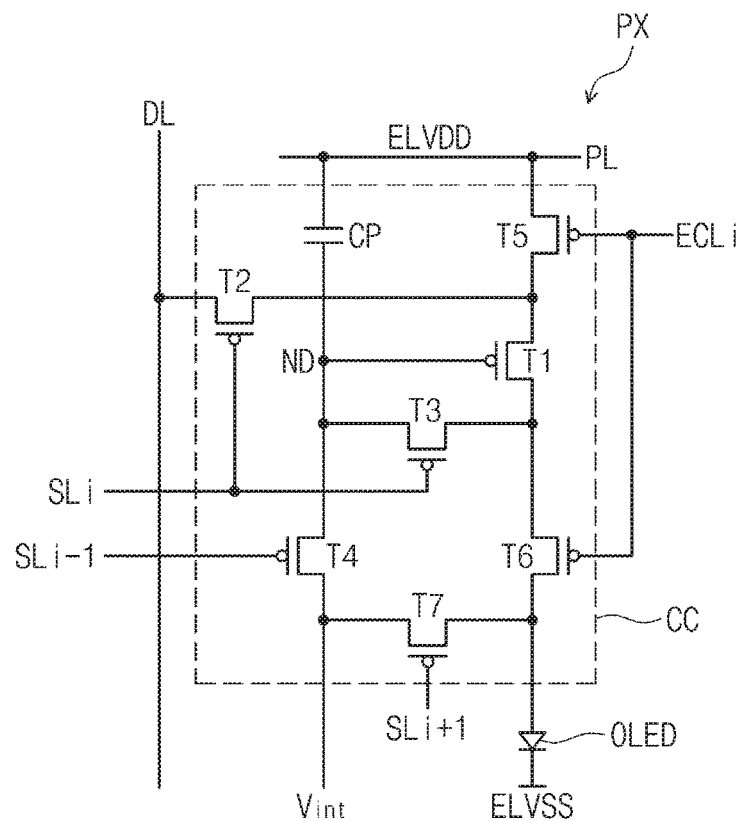
FIG. 6 is an equivalent circuit diagram illustrating a pixel according to an embodiment of the inventive concept.
Figure 7:
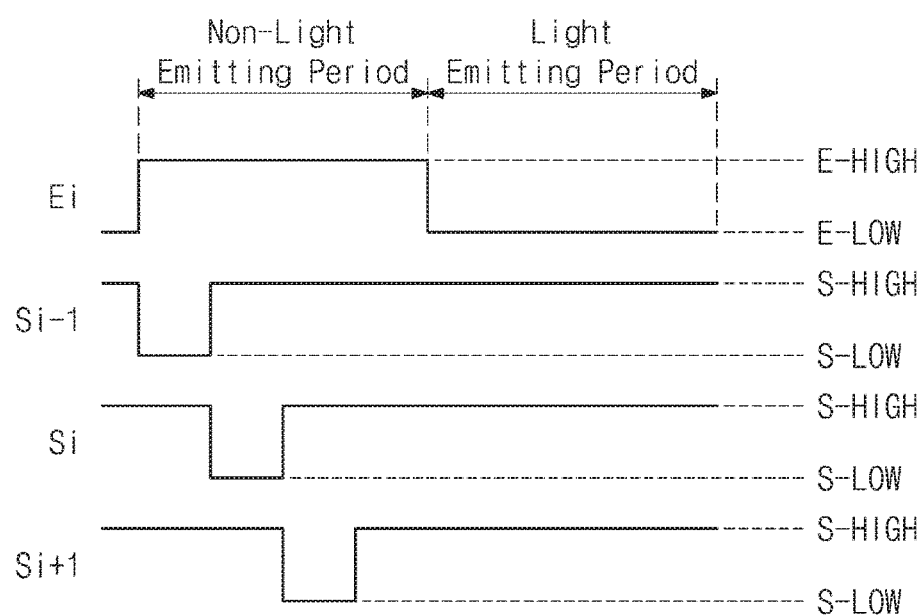
FIG. 7 is a view exemplarily illustrating a light emitting control signal and scan signals, which are applied to the pixel in FIG. 6.

FIG. 6 is an equivalent circuit diagram illustrating the pixel PX according to an embodiment of the inventive concept; and FIG. 7 is a view exemplarily illustrating a light emitting control signal Ei and scan signals Si−1, Si, Si+1, which are applied to the pixel PX in FIG. 6. In FIG. 6, the pixel PX connected to an i-th scan line SLi and an i-th light emitting control line ECLi is exemplarily illustrated.

The pixel PX may include an organic light emitting element OLED and a pixel circuit CC. The pixel circuit CC may include a plurality of transistors T1 to T7 and a capacitor CP. The pixel circuit CC controls a current amount flowing through the organic light emitting element OLED in response to the data signal.

The organic light emitting element OLED may emit light having luminance (e.g., predetermined luminance) in response to a current amount provided from the pixel circuit CC. To this end, the first power ELVDD may have a level greater than that of a second power ELVSS.

Each of the plurality of transistors T1 to T7 may include an input electrode (or a source electrode), an output electrode (or a drain electrode), and a control electrode (or a gate electrode). In this specification, one of the input electrode and the output electrode may be referred to as a first electrode, and the other thereof may be referred to as a second electrode for convenience.

The first transistor T1 includes the first electrode connected to the first power ELVDD through the fifth transistor T5 and the second electrode connected to an anode electrode of the organic light emitting element OLED through the sixth transistor T6. The first transistor T1 may be referred to as a driving transistor in this specification.

The first transistor T1 controls the current amount flowing through the organic light emitting element OLED in response to a voltage applied to the control electrode.

The second transistor T2 is connected between the data line DL and the first electrode of the first transistor T1. Also, the control electrode of the second transistor T2 is connected to the i-th scan line. The second transistor T2 is turned on when the i-th scan signal Si is provided to the i-th scan line SLi and electrically connects the data line DL to the first electrode of the first transistor T1.

The third transistor T3 is connected between the second electrode of the first transistor T1 and the control electrode. The control electrode of the third transistor T3 is connected to the i-th scan line SLi. The third transistor T3 is turned on when the i-th scan signal Si is provided to the i-th scan line SLi and electrically connects the second electrode of the first transistor T1 to the control electrode. Accordingly, when the third transistor T3 is turned on, the first transistor T1 is connected in a diamond form.

The fourth transistor T4 is connected between a node ND and an initialization power generation part (not shown). Also, the control electrode of the fourth transistor T4 is connected to a i−1-th scan line SLi−1. The fourth transistor T4 is turned on when a i−1-th scan signal Si−1 is provided to the i−1-th scan line SLi−1 and provides an initialization voltage Vint to the node ND.

The fifth transistor T5 is connected between the power line PL and the first electrode of the first transistor T1. The control electrode of the fifth transistor T5 is connected to the i-th light emitting control line ECLi.

The sixth transistor T6 is connected between the second electrode of the first transistor T1 and the anode electrode of the organic light emitting element OLED. Also, the control electrode of the sixth transistor T6 is connected to the i-th light emitting control line ECLi.

The seventh transistor T7 is connected between the initialization power generation part (not shown) and the anode electrode of the organic light emitting element OLED. Also, the control electrode of the seventh transistor T7 is connected to the i+1-th scan line SLi+1. The seventh transistor T7 is turned on when the i+1-th scan signal Si+1 is provided to the i+1-th scan line SLi+1 and provides the initialization voltage Vint to the anode electrode of the organic light emitting element OLED.

The seventh transistor T7 may improve a black expression ability of the pixel PX. Specifically, when the seventh transistor T7 is turned-on, a parasitic capacitor (not shown) of the organic light emitting element OLED is discharged. Then, when black luminance is realized, the organic light emitting element OLED may not emit light due to a leakage current from the first transistor T1, and, accordingly, the black expression ability may be improved.

Additionally, although the control electrode of the seventh transistor T7 is connected to the i+1-th scan line SLi+1 in FIG. 6, embodiments of the inventive concept are not limited thereto. In another embodiment of the inventive concept, the control electrode of the seventh transistor T7 may be connected to the i-th scan line SLi or the i−1-th scan line SLi−1.

Although FIG. 6 is illustrated with respect to a PMOS, embodiments of the inventive concept are not limited thereto. In another embodiment of the inventive concept, the pixel PX may include a NMOS. In another embodiment of the inventive concept, the pixel PX may include a combination of the NMOS and the PMOS.

The capacitor CP is disposed between the power line PL and the node ND.

The capacitor CP stores a voltage corresponding to the data signal. When the fifth transistor T5 and the sixth transistor T6 are turned-on, a current amount flowing through the first transistor T1 may be determined on the basis of a voltage stored in the capacitor CP.

However, embodiments of the inventive concept are not limited to the structure of the pixel PX shown in FIG. 6. In other embodiments of the inventive concept, the pixel PX may be realized in any of various shapes for allowing the organic light emitting element OLED to emit light.

Referring to FIG. 7, the light emitting control signal Ei may have a high level E-HIGH or a low level E-LOW. Each of the scan signals SLi−1, SLi, and SLi+1 may have a high level S-HIGH or a low level S-LOW.

When the light emitting control signal Ei has the high level E-HIGH, the fifth transistor T5 and the sixth transistor T6 are turned off. When the fifth transistor T5 is turned off, the first electrode of the first transistor T1 and the power line PL are electrically cut off. When the sixth transistor T6 is turned off, the second electrode of the first transistor T1 and the anode electrode of the organic light emitting element OLED are electrically cut off. Accordingly, the organic light emitting element OLED does not emit light during a period in which the light emitting control signal Ei having the high level E-HIGH is provided to the i-th light emitting control line ECLi.

Thereafter, when the i−1-th scan signal Si−1 provided to the i−1-th scan line SLi−1 has the low level S-LOW, the fourth transistor T4 is turned on. When the fourth transistor T4 is turned on, the initialization voltage Vint is provided to the node ND.

When the i-th scan signal Si provided to the i-th scan line SLi has the low level S-LOW, the second transistor T2 and the third transistor T3 are turned on.

When the second transistor T2 is turned on, the data signal is provided to the first electrode of the first transistor T1. Here, since the node ND is initialized by the initialization voltage Vint, the first transistor T1 is turned on. When the first transistor T1 is turned on, a voltage corresponding to the data signal is provided to the node ND. Here, the capacitor CP stores the voltage corresponding to the data signal.

When the i+1-th scan signal Si+1 provided to the i+1-th scan line SLi+1 has the low level S-LOW, the seventh transistor T7 is turned on.

When the seventh transistor T7 is turned on, the initialization voltage Vint is provided to the anode electrode of the organic light emitting element OLED, and the parasitic capacitor of the organic light emitting element OLED is discharged.

When the light emitting control signal Ei provided to the light emitting control line ECLi has the low level E-LOW, the fifth transistor T5 and the sixth transistor T6 are turned on. When the fifth transistor T5 is turned on, the first power ELVDD is provided to the first electrode of the first transistor T1. When the sixth transistor T6 is turned on, the second electrode of the first transistor T1 and the anode electrode of the organic light emitting element OLED are electrically connected to each other. Then, the organic light emitting element OLED generates light having luminance (e.g., predetermined luminance) corresponding to a provided current amount.

Figure 8:
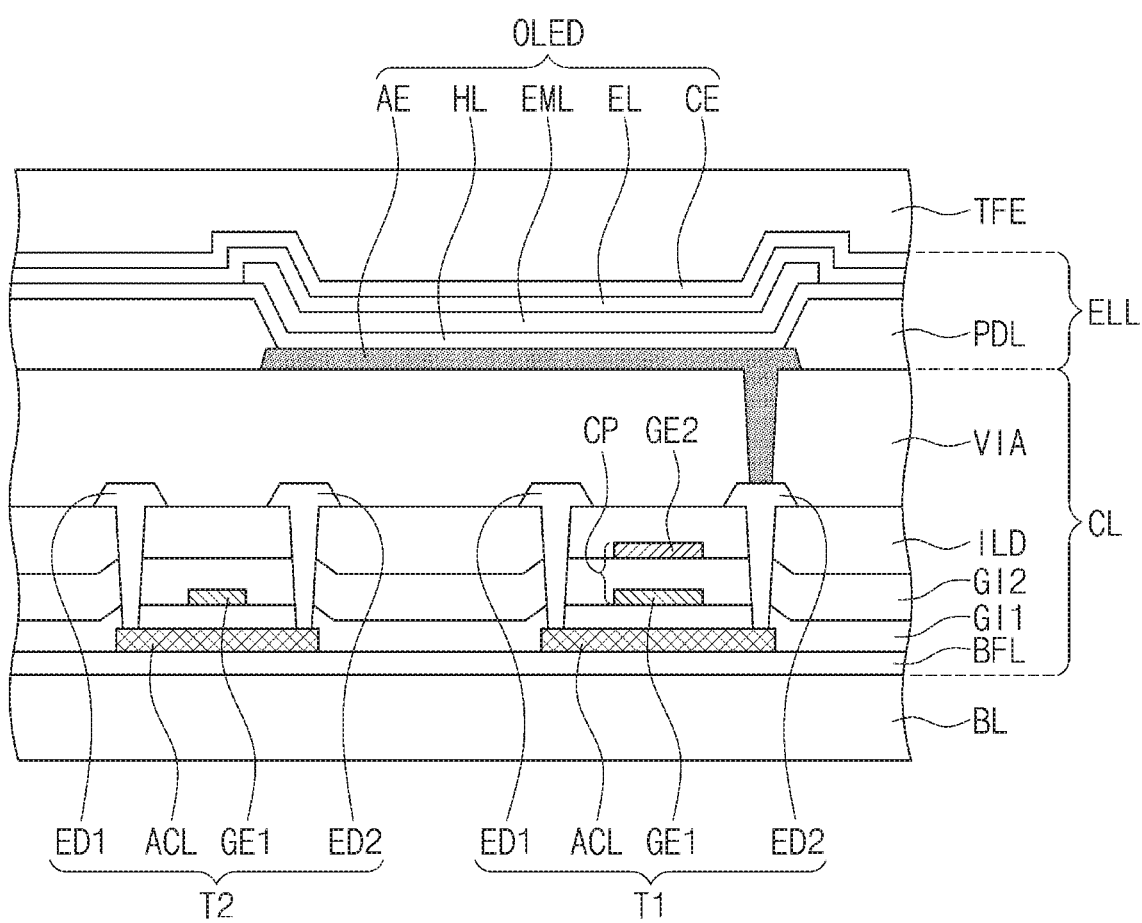
FIG. 8 is a cross-sectional view illustrating a portion of a pixel according to an embodiment of the inventive concept.

FIG. 8 is a cross-sectional view illustrating a portion of the pixel PX (refer to FIG. 6) according to an embodiment of the inventive concept. Although the first transistor T1 and the second transistor T2 are exemplarily illustrated in FIG. 8, embodiments of the inventive concept are not limited to the structure of the first transistor T1 and the second transistor T2. Although a second electrode ED2 of the first transistor T1 directly contacts an anode electrode AE of the pixel PX in FIG. 8, this illustration shows only a cross-sectional shape. In an embodiment, the first transistor T1 may be connected to the anode electrode AE of the pixel PX through the sixth transistor T6 as in FIG. 6. However, embodiments of the inventive concept are not limited thereto. In another embodiment of the inventive concept, the second electrode ED2 of the first transistor T1 directly contacts the anode electrode AE of the pixel PX.

The display panel DP (refer to FIG. 5) may include a base layer BL, a circuit layer CL, a light emitting element layer ELL, and an encapsulation layer TFE.

The circuit layer CL may include a buffer layer BFL, gate insulation layers GI1 and GI2, an interlayer insulation layer ILD, a circuit insulation layer VIA, and transistors T1 and T2.

The light emitting element layer ELL may include an organic light emitting element OLED and a pixel defining layer PDL.

The encapsulation layer TFE may seal the light emitting element layer ELL to protect the light emitting element layer ELL against external oxygen or moisture.

The buffer layer BFL is disposed on one surface of the base layer BL.

The buffer layer BFL prevents or substantially prevents impurities existing in the base layer BL from being introduced into the pixel PX during a manufacturing process. In particular, the buffer layer BFL prevents or substantially prevents the impurities from being diffused into active portions ACL of the transistors T1 and T2 constituting the pixel PX.

The impurities may be introduced from the outside or generated when the base layer BL is thermally decomposed. The impurities may include a gas or sodium discharged from the base layer BL. Also, the buffer layer BFL blocks moisture introduced into the pixel PX from the outside.

The active portions ACL constituting each of the transistors T1 and T2 are disposed on the buffer layer BFL. In an embodiment, each of the active portions ACL may include amorphous silicon or polysilicon. In an embodiment, each of the active portions ACL may include a metallic oxide semiconductor.

Each of the active portions ACL may include a channel region that serves as a passage through which an electron or a hole is movable, and a first ion doping region and a second ion doping region, which are disposed with the channel region therebetween.

A first gate insulation layer GI1 covering the active portions ACL is disposed on the buffer layer BFL. The first gate insulation layer GI1 includes an organic layer and/or an inorganic layer. The first gate insulation layer GI1 may include a plurality of inorganic thin-films. The plurality of inorganic thin-films may include a silicon nitride layer and a silicon oxide layer.

The control electrodes GE1 constituting each of the transistors T1 and T2 are disposed on the first gate insulation layer GI1. The control electrode GE1 of the first transistor T1 may be one of two electrodes constituting the capacitor CP. At least a portion of the scan lines SL (refer to FIG. 5) and the light emitting control lines ECL (refer to FIG. 5) may be disposed on the first gate insulation layer GI1.

A second gate insulation layer GI2 covering the control electrodes GE1 is disposed on the first gate insulation layer GI1. The second gate insulation layer GI2 includes an organic layer and/or an inorganic layer. The second gate insulation layer GI2 may include a plurality of inorganic thin-films. The plurality of inorganic thin-films may include a silicon nitride layer and a silicon oxide layer.

The other electrode GE2 of the two electrodes constituting the capacitor CP (refer to FIG. 6) may be disposed on the second gate insulation layer GI2. That is, in an embodiment, the electrode GE1 disposed on the first gate insulation layer GI1 and the electrode GE2 disposed on the second gate insulation layer GI2 overlap each other to provide the capacitor CP in FIG. 6. However, embodiments of the inventive concept are not limited to the arrangement structure of the electrodes constituting the capacitor CP.

The interlayer insulation layer ILD covering the electrode GE2 is disposed on the second gate insulation layer GI2. The interlayer insulation layer ILD includes an organic layer and/or inorganic layer. The interlayer insulation layer ILD may include a plurality of inorganic thin-films. The plurality of inorganic thin-films may include a silicon nitride layer and a silicon oxide layer.

At least a portion of the data line DL (refer to FIG. 5) and the power line PL (refer to FIG. 5) may be disposed on the interlayer insulation layer ILD. The first electrode ED1 and the second electrode ED2 of each of the transistors T1 and T2 may be disposed on the interlayer insulation layer ILD.

The first electrodes ED1 and the second electrodes ED2 may be connected to the corresponding active portions ACL through a through-hole passing through the gate insulation layers GI1 and GI2 and the interlayer insulation layer ILD, respectively.

The circuit insulation layer VIA covering the first electrodes ED1 and the second electrodes ED2 is disposed on the interlayer insulation layer ILD. The circuit insulation layer VIA includes an organic layer and/or inorganic layer. The circuit insulation layer VIA may provide a planarization surface.

The pixel defining layer PDL and the organic light emitting element OLED are disposed on the circuit insulation layer VIA.

The organic light emitting element OLED may include an anode electrode AE, a hole control layer HL, a light emitting layer EML, an electron control layer EL, and a cathode electrode CE.

Figure 10:
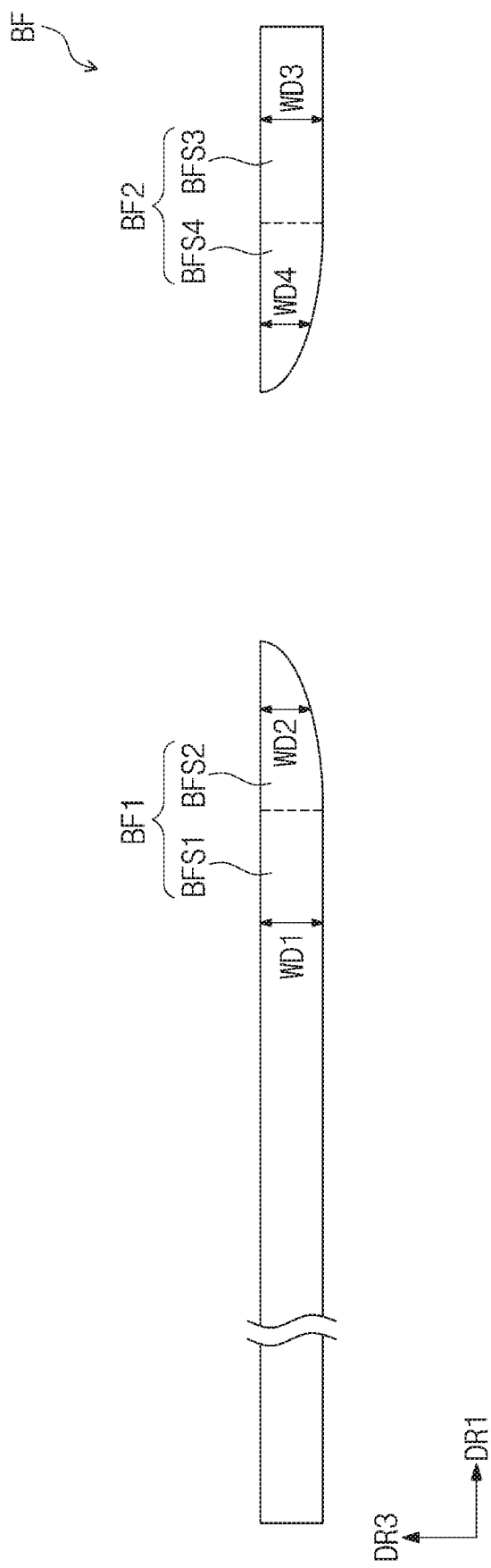
FIG. 10 is a view exemplarily illustrating a coating layer in FIG. 9A according to an embodiment of the inventive concept.

FIGS. 9A and 9B are views exemplarily illustrating the display panel DP and the coating layer BF according to an embodiment of the inventive concept; and FIG. 10 is a view exemplarily illustrating the coating layer BF in FIG. 9A.

FIG. 9A illustrates the display panel DP and the coating layer BF before the display device DD is assembled; and FIG. 9B illustrates the display panel DP and the coating layer BF after the display device DD is assembled. The coating layer BF may include a first coating layer BF1 and a second coating layer BF2.

Referring to FIGS. 5, 9A, and 9B, the bending area BA of the display panel DP is bent, as shown in FIG. 9B.

The base layer BL may include a first portion BLS1, a second portion BLS2 extending from the first portion BLS1, and a third portion BLS3 extending from the second portion BLS2.

The base layer BL may include a first surface SF1 and a second surface SF2. The first surface SF1 and the second surface SF2 may face away from each other. The first surface SF1 may include a first area AR1, a second area AR2 extending from the first area AR1, and a third area AR3 extending from the second area AR2. The second surface SF2 may include a fourth area AR4 opposite the first area AR1, a fifth area AR5 opposite the second area AR2 and extending from the fourth area AR4, and a sixth area AR6 opposite the third area AR3 and extending from the fifth area AR5.

The circuit layer CL may contact the first surface SF1 of the base layer BL.

The light emitting element layer ELL may be disposed on the circuit layer CL and overlap the first area AR1. The first coating layer BF1 may contact the fourth area AR4.

The second portion BLS2 may correspond to the bending area BA. The second portion BLS2 may be bent to have a curvature (e.g., a predetermined curvature).

The data driving unit 200 may be disposed to overlap the third area AR3. The second coating layer BF2 may contact the sixth area AR6.

The first coating layer BF1 may include a first coating portion BFS1 and a second coating portion BFS2. The second coating portion BFS2 may be disposed closer to the second portion BLS2 of the base layer BL than the first coating portion BFS1.

The first coating portion BFS1 may have a first thickness WD1, and the second coating portion BFS2 may have a second thickness WD2. The second thickness WD2 is less than the first thickness WD1. In an embodiment of the inventive concept, the first thickness WD1 may be about 75 μm or more and about 100 μm or less.

In an embodiment, the first thickness WD1 of the first coating portion BFS1 may be constant in the first direction DR1.

On the other hand, the second thickness WD2 of the second coating portion BFS2 may gradually decrease in a direction toward the second portion BLS2 of the base layer BL in the first direction DR1. Accordingly, one end of the second coating portion BFS2 may have a rounded shape in a cross-section.

In an embodiment, the first coating layer BF1 may be printed on the second surface of the first portion BLS1 by a coating device in an ink-jet printing method. Accordingly, the second thickness WD2 may be adjusted by adjusting an amount of a coating solution sprayed from the coating device.

The second coating layer BF2 may include a third coating portion BFS3 and a fourth coating portion BFS4. The fourth coating portion BFS4 may be disposed closer to the second portion BLS2 of the base layer BL than the third coating portion BFS3.

The third coating portion BFS3 may have a third thickness WD3, and the fourth coating portion BFS4 may have a fourth thickness WD4. The fourth thickness WD4 is less than the third thickness WD3. In an embodiment of the inventive concept, the third thickness WD3 may be about 75 μm or more and about 100 μm or less.

In an embodiment, the third thickness WD3 of the third coating portion BFS3 may be constant in the first direction DR1. In an embodiment, the third thickness WD3 may be substantially the same as the first thickness WD1.

On the other hand, the fourth thickness WD4 of the fourth coating portion BFS4 may gradually decrease in a direction toward the second portion BLS2 of the base layer BL in the first direction DR1. Accordingly, one end of the fourth coating portion BFS4 may have a rounded shape in a cross-section.

In an embodiment, the second coating layer BF2 may be printed on the second surface of the third portion BLS3 by a coating device in an ink-jet printing method. Accordingly, the fourth thickness WD4 may be adjusted by adjusting an amount of a coating solution sprayed from the coating device.

As described above, when the bending area BA of the display panel DP is bent, a portion of the coating layer BF, which is adjacent to the bending area BA, may be prevented or substantially prevented from being damaged by adjusting the second thickness WD2 of the second coating portion BFS2 and the fourth thickness WD4 of the fourth coating portion BFS4.

In an embodiment of the inventive concept, a range in which each of the first coating layer BF1 and the second coating layer BF2 is deformed by heat may be about 5 μm or more and about 20 μm or less. In an embodiment of the inventive concept, a thickness variation range of each of the first coating layer BF1 and the second coating layer BF2 may be about 5% or more and about 30% or less.

In an embodiment of the inventive concept, each of the first coating layer BF1 and the second coating layer BF2 may not be thermally deformed even in a range of about 120° C. or more and about 180° C. or less. That is, each of the first coating layer BF1 and the second coating layer BF2 may perform a function without being deformed in shape even in a range of about 120° C. or more and about 180° C. or less.

Figure 11:
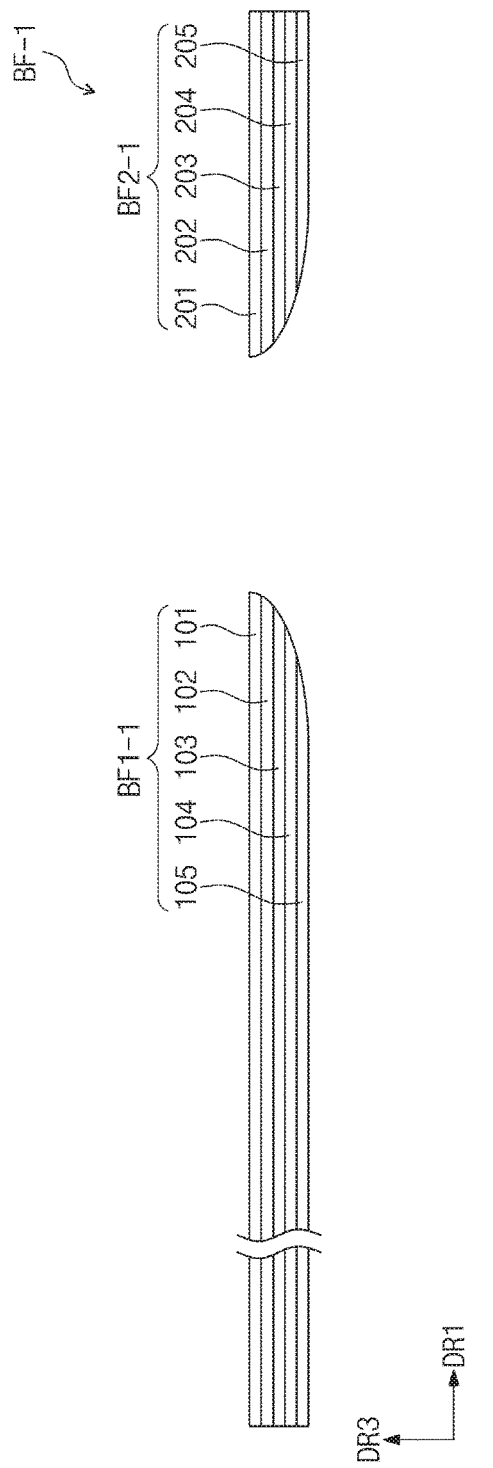
FIGS. 11 to 13 are views each illustrating a coating layer according to an embodiment of the inventive concept.
Figure 12:
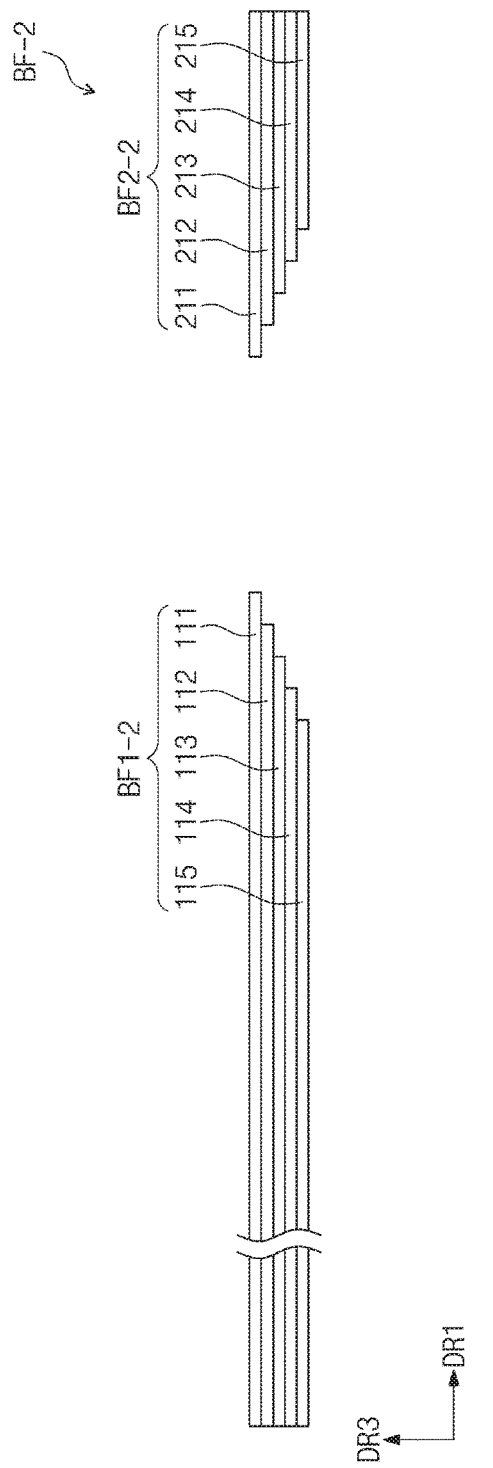
Figure 13:
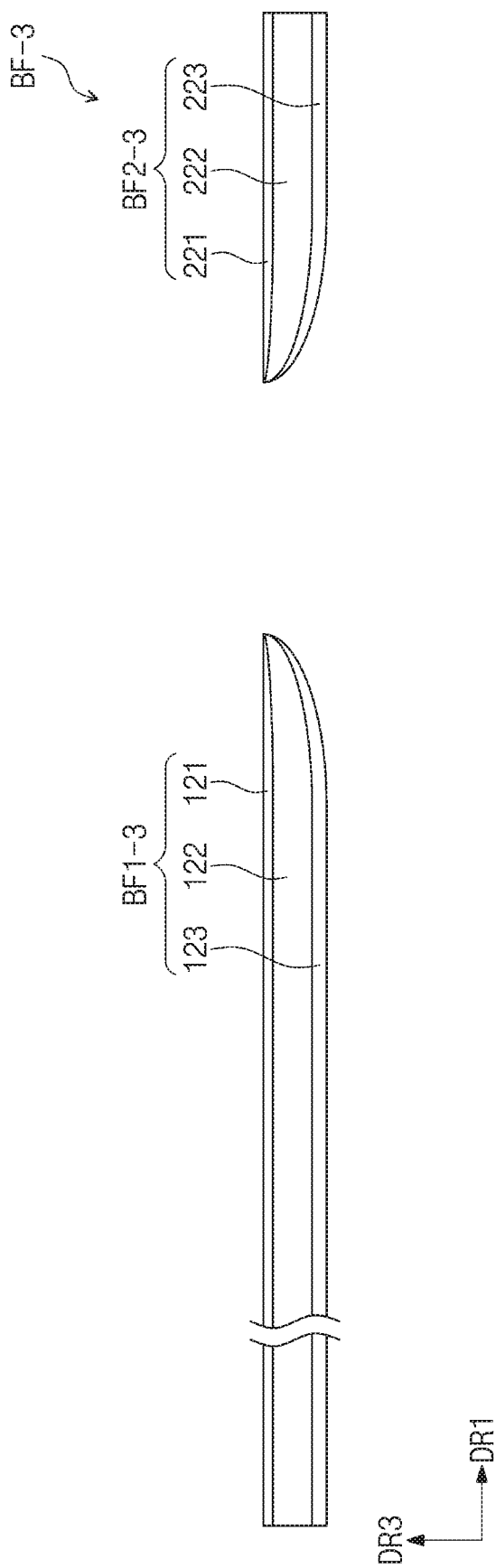

FIGS. 11 to 13 are views illustrating coating layers BF-1, BF-2, and BF-3, respectively, according to embodiments of the inventive concept.

Referring to FIG. 11, the coating layer BF-1 may include a first coating layer BF1-1 and a second coating layer BF2-1.

The first coating layer BF1-1 may include a plurality of first sub-coating layers 101 to 105. One end of each of the first sub-coating layers 101 to 105 may have a rounded shape.

The first sub-coating layers 101 to 105 may have different lengths from each other in the first direction DR1. As described above, the first coating layer BF1-1 may be adjusted in shape by using length differences between the first sub-coating layers 101 to 105.

In an embodiment, each of the first sub-coating layers 101 to 105 may be printed by a coating device in an ink-jet printing method. That is, the first coating layer BF1-1 may be formed by being coated a plurality of times by the coating device.

The second coating layer BF2-1 may include a plurality of second sub-coating layers 201 to 205. One end of each of the second sub-coating layers 201 to 205 may have a rounded shape.

The second sub-coating layers 201 to 205 may have different lengths from each other in the first direction DR1. As described above, the second coating layer BF2-1 may be adjusted in shape by using length differences between the second sub-coating layers 201 to 205.

In an embodiment, each of the second sub-coating layers 201 to 205 may be printed by a coating device in an ink-jet printing method. That is, the second coating layer BF2-1 may be formed by being coated a plurality of times by the coating device.

Although five first sub-coating layers 101 to 105 and five second sub-coating layers 201 to 205 are exemplarily illustrated in FIG. 11, embodiments of the inventive concept are not limited thereto. In another embodiment of the inventive concept, each of the number of the first sub-coating layers and the number of the second sub-coating layers may be less or greater than about five.

Referring to FIG. 12, the coating layer BF-2 may include a first coating layer BF1-2 and a second coating layer BF2-2.

The first coating layer BF1-1 may include a plurality of first sub-coating layers 111 to 115. Unlike the first sub-coating layers 101 to 105 in FIG. 11, one end of each of the first sub-coating layers 111 to 115 in FIG. 12 may not have a rounded shape.

The second coating layer BF2-2 may include a plurality of second sub-coating layers 211 to 215. Unlike the second sub-coating layers 201 to 205 in FIG. 11, the one end of each of the second sub-coating layers 211 to 215 in FIG. 12 may not have a rounded shape.

Other descriptions except for the above description may be substantially the same as those described with reference to FIG. 11, and are thus omitted.

Referring to FIG. 13, the coating layer BF-3 may include a first coating layer BF1-3 and a second coating layer BF2-3.

The first coating layer BF1-3 may include a first adhesive layer 121, a first thickness determining layer 122, and a first heat dissipation layer 123. The second coating layer BF2-3 may include a second adhesive layer 221, a second thickness determining layer 222, and a second heat dissipation layer 223. In an embodiment, the heat dissipation layers 123 and 223 may include carbon or graphite.

In an embodiment, the first adhesive layer 121 and the second adhesive layer 221 each may include a pressure sensitive adhesive (PSA), wherein each of the thickness of the first adhesive layer 121 and the second adhesive layer 221 is about 5 μm or more and about 20 μm or less.

In an embodiment, the first thickness determining layer 122 and the second thickness determining layer 222 each may include a protection layer or a cushion layer, wherein each of the thickness of the first thickness determining layer 122 and the second thickness determining layer 222 is about 45 μm or more and about 80 μm or less.

In an embodiment, the first heat dissipation layer 123 and the second heat dissipation layer 223 each may include a carbon or a graphite, wherein each of the thickness of the first heat dissipation layer 123 and the second heat dissipation layer 223 is about 10 μm or more and about 30 μm or less.

Description of aspects other than those proved above may be substantially the same as those described with reference to FIG. 11, and are thus omitted.

According to embodiments of the inventive concept, the coating layer disposed below the display panel is not damaged when a portion of the display panel is folded, and the display device having the narrow bezel may be provided.

The above-disclosed subject matter is to be considered illustrative and not restrictive, and the appended claims are intended to cover all such modifications, enhancements, and other embodiments, which fall within the spirit and scope of the inventive concept. Thus, the scope of the inventive concept is to be determined by the broadest permissible interpretation of the claims and their equivalents, and shall not be restricted or limited by the foregoing detailed description.

What is claimed is:

1. A display device comprising:
   a base layer comprising a first portion, a second portion extending from the first portion and bent to have a curvature, and a third portion extending from the second portion and facing the first portion, the first portion overlapping the third portion along a thickness direction of the display device;
   a light emitting element layer on a first surface of the first portion and comprising a plurality of light emitting elements;
   a driving circuit on a first surface of the third portion and electrically connected to the plurality of light emitting elements; and
   a first coating layer on a second surface of the first portion and comprising a first coating portion and a second coating portion extending from the first coating portion and located adjacent to the second portion, wherein the second coating portion is located on a planar region of the first portion and has a second thickness less than a first thickness of the first coating portion, wherein the planar region of the first portion overlaps respective regions of the first and second coating portions having the first and second thicknesses along the thickness direction of the display device.

2. The display device of claim 1, wherein the first coating layer contacts the second surface of the first portion.

3. The display device of claim 2, wherein the first coating layer comprises a resin.

4. The display device of claim 3, wherein the second thickness of the second coating portion gradually decreases in a direction toward the second portion.

5. The display device of claim 4, wherein an end of the second coating portion has a rounded shape in a cross-section.

6. The display device of claim 4, further comprising a second coating layer on a second surface of the third portion and comprising a third coating portion and a fourth coating portion extending from the third coating portion and located adjacent to the second portion, wherein the fourth coating portion has a thickness less than that of the third coating portion.

7. The display device of claim 6, wherein the second coating layer contacts the second surface of the third portion.

8. The display device of claim 7, wherein the second coating layer comprises a resin.

9. The display device of claim 8, wherein the thickness of the fourth coating portion gradually decreases in a direction toward the second portion.

10. The display device of claim 9, wherein an end of the fourth coating portion has a rounded shape in a cross-section.

11. The display device of claim 9, wherein the first coating layer contacts only the first portion of the base layer, and the second coating layer contacts only the third portion of the base layer.

12. The display device of claim 11, wherein the first coating layer and the second coating layer face each other.

13. The display device of claim 11, wherein each of the first thickness of the first coating portion and the thickness of the third coating portion is about 75 μm or more and about 100 μm or less.

14. The display device of claim 11, wherein at least one of the first coating layer and the second coating layer comprises a plurality of sub-coating layers.

15. The display device of claim 14, wherein at least one of the sub-coating layers comprises carbon or graphite.

16. The display device of claim 1, wherein a thickness of the first coating layer is deformable by about 5 μm or more and about 20 μm or less due to heat applied from the outside.

17. The display device of claim 1, wherein the first coating layer is not thermally deformable by heat of about 120° C. or more and about 180° C. or less.

18. A display device comprising:
   a base layer comprising a first surface and a second surface facing away from the first surface, wherein the first surface comprises a first area, a second area extending from the first area, and a third area extending from the second area, and the second surface comprises a fourth area opposite the first area, a fifth area opposite the second area, and a sixth area opposite the third area;
   a circuit layer contacting the first surface and comprising a plurality of transistors;
   a light emitting element layer comprising a plurality of light emitting elements that are electrically connected to the plurality of transistors and overlapping the first area;
   a first coating layer contacting the fourth area and comprising a portion having a thickness that gradually decreases in a direction toward the fifth area; and
   a second coating layer contacting the sixth area and comprising a portion having a thickness that gradually decreases in a direction toward the fifth area.

19. The display device of claim 18, wherein each of the second area and the fifth area is bent to have a curvature.

20. The display device of claim 19, wherein at least one of the first coating layer and the second coating layer comprises a plurality of sub-coating layers.

21. The display device of claim 20, wherein at least one of the sub-coating layers comprises carbon or graphite.

* * * * *